US012009418B2

(12) United States Patent
Bertness et al.

(10) Patent No.: US 12,009,418 B2
(45) Date of Patent: Jun. 11, 2024

(54) CORE-SHELL NANOFIN VERTICAL SWITCH AND HIGH-VOLTAGE SWITCHING

(71) Applicant: Government of the United States of America, as represented by the Secretary of Commerce, Gaithersburg, MD (US)

(72) Inventors: Kristine Ann Bertness, Boulder, CO (US); Matthew David Brubaker, Louisville, CO (US); Patrick John Fay, Granger, IN (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 104 days.

(21) Appl. No.: 17/821,977

(22) Filed: Aug. 24, 2022

(65) Prior Publication Data
US 2023/0060711 A1    Mar. 2, 2023

Related U.S. Application Data

(60) Provisional application No. 63/236,897, filed on Aug. 25, 2021.

(51) Int. Cl.
*H01L 29/778* (2006.01)
*H01L 29/06* (2006.01)
(Continued)

(52) U.S. Cl.
CPC ...... *H01L 29/7788* (2013.01); *H01L 29/0634* (2013.01); *H01L 29/2003* (2013.01);
(Continued)

(58) Field of Classification Search
CPC .................................................. H01L 29/7788
(Continued)

(56) References Cited

U.S. PATENT DOCUMENTS 9,460,921 B2 * 10/2016 Bertness ........... H01L 21/02458

OTHER PUBLICATIONS

Ueda, T., "GaN power devices: current status and future challenges", Japanese Journal of Applied Physics, 2019, p. SC0804, vol. 58.
(Continued)

*Primary Examiner* — Tomi Skibinski
(74) *Attorney, Agent, or Firm* — Office of Chief Counsel for National Institute of Standards and Technology (57) ABSTRACT

A core-shell nanofin vertical switch performs high-voltage switching and includes: an n-type GaN nanofin core including: an n-type drift layer; an n-type channel; and an n-type source; a p-type nanofin shell surrounding the n-type GaN nanofin core at an interface surface of the n-type GaN nanofin core, and comprising GaN; an optional source contact disposed on the n-type GaN nanofin core and the p-type nanofin shell and in electrical communication with the n-type source, such that the n-type source is interposed between the source contact and the n-type channel; and a gate contact disposed on the p-type nanofin shell and in electrical communication with the p-type nanofin shell, such that the p-type nanofin shell is interposed between the gate contact and the n-type channel, and the gate contact is interposed between the source contact and a drain contact.

23 Claims, 7 Drawing Sheets

(51) Int. Cl.
  *H01L 29/20*   (2006.01)
  *H01L 29/205*  (2006.01)
  *H01L 29/66*   (2006.01)
  *H03K 17/687*  (2006.01)

(52) U.S. Cl.
  CPC ...... *H01L 29/205* (2013.01); *H01L 29/66462* (2013.01); *H03K 17/6871* (2013.01)

(58) Field of Classification Search
  USPC .......................................................... 257/15
  See application file for complete search history.

(56) References Cited

OTHER PUBLICATIONS

Zhang, Y., et al., "(Ultra)Wide-Bandgap Vertical Power FinFETs", IEEE Transactionson Electron Devices, 2020, p. 3960-3971, vol. 67 No.10.

Pushpakaran, B.N., et al., "Commercial GaN-Based Power Electronic Systems: A Review", Journal of Electronic Materials, 2020, p. 6247-6261, vol. 49 No.11.

Fatahilah, M.F., et al., "3D GaN nanoarchitecture for field-effect transistors", Micro and Nano Engineering, 2019, p. 59-81, vol. 3.

\* cited by examiner

FIG. 7

CORE-SHELL NANOFIN VERTICAL SWITCH AND HIGH-VOLTAGE SWITCHING

CROSS REFERENCE TO RELATED APPLICATIONS

This application claims the benefit of U.S. Provisional Patent Application Ser. No. 63/236,897 (filed Aug. 25, 2021), which is herein incorporated by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in this invention.

BRIEF DESCRIPTION

Disclosed is a core-shell nanofin vertical switch for high-voltage switching, the core-shell nanofin vertical switch comprising: an n-type GaN nanofin core comprising: an n-type drift layer arranged at a drain terminus of the n-type GaN nanofin core and comprising GaN; an n-type channel disposed on the n-type drift layer and comprising GaN; and an n-type source disposed on the n-type channel layer, arranged at a source terminus, and comprising GaN, such that the n-type channel is interposed between the n-type source and the n-type drift layer; a p-type nanofin shell disposed on the n-type GaN nanofin core, surrounding the n-type GaN nanofin core at an interface surface of the n-type GaN nanofin core, and comprising GaN; an optional source contact disposed on the n-type GaN nanofin core and the p-type nanofin shell and in electrical communication with the n-type source, such that the n-type source is interposed between the source contact and the n-type channel; and a gate contact disposed on the p-type nanofin shell and in electrical communication with the p-type nanofin shell, such that the p-type nanofin shell is interposed between the gate contact and the n-type channel, and the gate contact is interposed between the source contact and a drain contact.

Disclosed is a process for high-voltage switching with a core-shell nanofin vertical switch, the process comprising: receiving, by a drain contact of a core-shell nanofin vertical switch, a drain voltage, the core-shell nanofin vertical switch comprising: an n-type GaN nanofin core comprising: an n-type drift layer arranged at a drain terminus of the n-type GaN nanofin core and comprising GaN; an n-type channel disposed on the n-type drift layer and comprising GaN; and an n-type source disposed on the n-type channel layer, arranged at a source terminus, and comprising GaN, such that the n-type channel is interposed between the n-type source and the n-type drift layer; a p-type nanofin shell disposed on the n-type GaN nanofin core, surrounding the n-type GaN nanofin core at an interface surface of the n-type GaN nanofin core, and comprising GaN; an optional source contact disposed on the n-type GaN nanofin core and the p-type nanofin shell and in electrical communication with the n-type source, such that the n-type source is interposed between the source contact and the n-type channel; a gate contact disposed on the p-type nanofin shell and in electrical communication with the p-type nanofin shell, such that the p-type nanofin shell is interposed between the gate contact and the n-type channel, and the gate contact is interposed between the source contact and the drain contact; and the drain contact disposed on the n-type drift layer, such that the drain contact is in electrical communication via ohmic contact with the n-type drift layer; turning on the core-shell nanofin vertical switch by: receiving, by the gate contact, a gate voltage that is positive with respect to a ground potential; accumulating electron charge carriers in the n-type GaN nanofin core in response to receiving the gate voltage; flowing electrical current between the source contact and the drain contact in response to accumulating electron charge carriers; turning off the core-shell nanofin vertical switch by: receiving, by the gate contact, the gate voltage that is at ground potential or negative with respect to a ground potential; depleting the electron charge carriers from the n-type GaN nanofin core in response to receiving the gate voltage at ground potential or negative with respect to a ground potential; and terminating flow of electrical current between the source contact and the drain contact in response to depleting the electron charge carriers.

BRIEF DESCRIPTION OF THE DRAWINGS

The following description cannot be considered limiting in any way. Various objectives, features, and advantages of the disclosed subject matter can be more fully appreciated with reference to the following detailed description of the disclosed subject matter when considered in connection with the following drawings, in which like reference numerals identify like elements.

DETAILED DESCRIPTION

A detailed description of one or more embodiments is presented herein by way of exemplification and not limitation.

There is a need for a semiconductor transistor that can handle a large voltage (e.g., greater than 1 kV) with a low resistive loss. Such a transistor can be used in power electronics such as converters or motor drivers. Gallium nitride has materials properties that include high electron mobility and a large breakdown field that make it a candidate for high-power transistors. However, it is difficult to make GaN transistors with a vertical architecture for use in power electronics devices, where current flows normal to the wafer surface. Vertical transistor architectures involve fabrication of lateral p-n junctions that are hard to produce in GaN because ion implantation and diffusion doping are not effective in this material system. Instead, etching and epitaxial regrowth are used to produce lateral p-n junctions in vertical GaN transistors. This approach suffers greatly from unintentional contamination of the regrowth interface and device active area during regrowth, which leads to high electrical leakage currents, low-voltage breakdown, and difficulties in engineering the space-charge regions of the p-n junctions. The core-shell nanofin vertical switch 100 and process for making the core-shell nanofin vertical switch 100 described herein overcome these technical shortcomings of conventional technology.

It has been discovered that a core-shell nanofin vertical switch 100 described herein provides switching at high source-to-drain voltages (e.g., greater than 1 kV) at a low on-state resistance (e.g., less than 0.2 mohm*cm^2) and with normally-off (enhancement-mode) operation. The core-shell nanofin vertical switch 100 can be used for high-efficiency semiconductor power electronics, such as a power converter or motor driver, e.g., for an electric vehicle.

Core-shell nanofin vertical switch 100 performs high-voltage switching. In an embodiment, with reference to FIG. 1, FIG. 2, and FIG. 3, core-shell nanofin vertical switch 100 includes: n-type GaN nanofin core 107 including: n-type drift layer 108 arranged at drain terminus 103 of n-type GaN nanofin core 107 and including GaN; n-type channel 110 disposed on n-type drift layer 108 and including GaN; and n-type source 112 disposed on n-type channel layer 110, arranged at source terminus 101, and including GaN, such that n-type channel 110 is interposed between n-type source 112 and n-type drift layer 108; p-type nanofin shell 114 disposed on n-type GaN nanofin core 107, surrounding n-type GaN nanofin core 107 at interface surface 105 of n-type GaN nanofin core 107, and including GaN; source contact 122 disposed on n-type GaN nanofin core 107 and p-type nanofin shell 114 and in electrical communication with n-type source 112, such that n-type source 112 is interposed between source contact 122 and n-type channel 110; and gate contact 118 disposed on p-type nanofin shell 114 and in electrical communication with p-type nanofin shell 114, such that p-type nanofin shell 114 is interposed between gate contact 118 and n-type channel 110, and gate contact 118 is interposed between source contact 122 and drain contact 124.

Core shell nanofin vertical switch 100 can be used as a digital switch or as an analog switch, wherein core shell nanofin vertical switch 100 can operate as an on/off switch for electrical isolation or conduction, or wherein core shell nanofin vertical switch 100 can operate as an analog device to provide continuity in varying an amount of electrical current being supplied by core shell nanofin vertical switch 100, e.g., to modulate electrical current such as providing modulated current to a motor.

Figure 1:
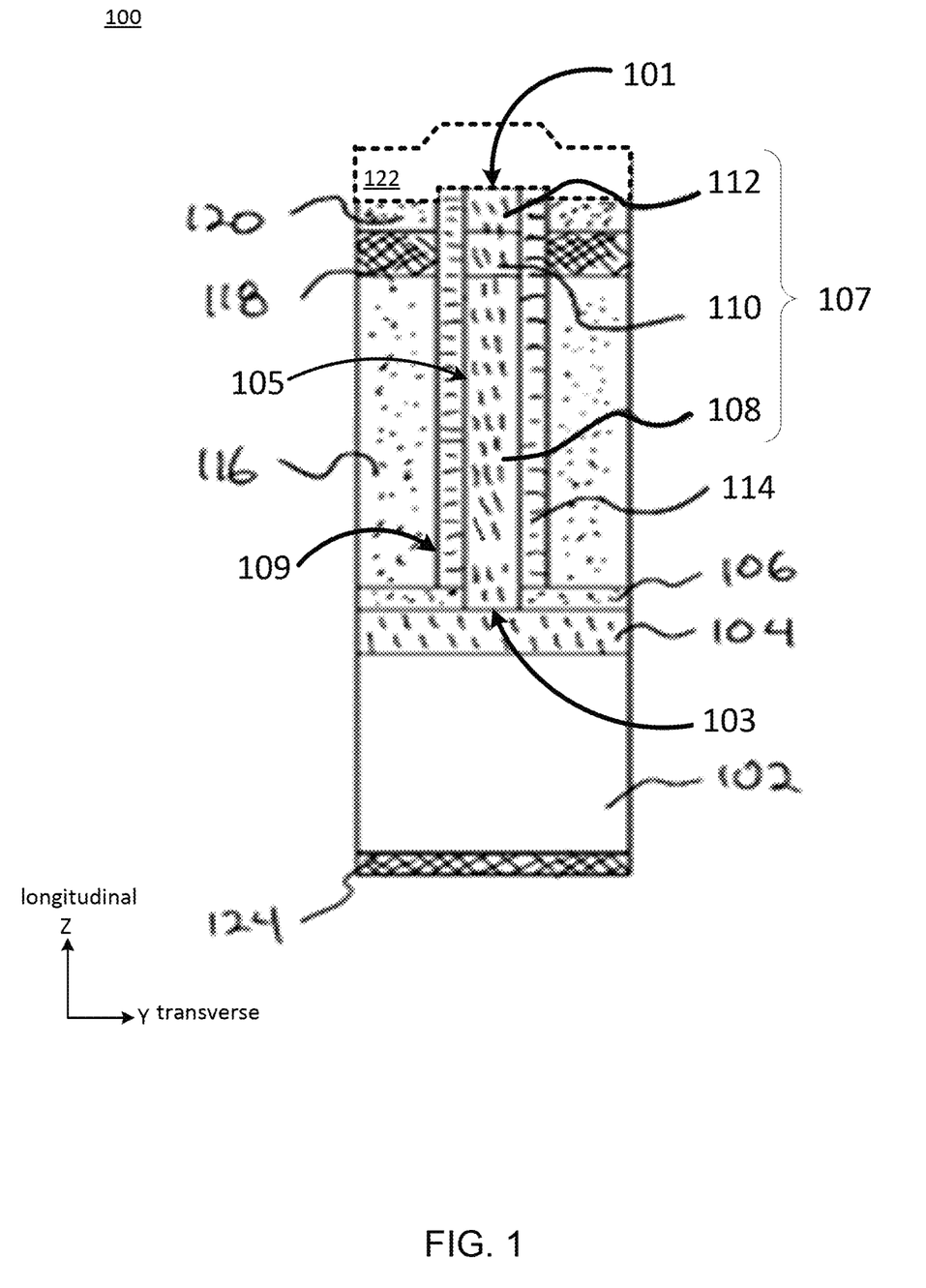
FIG. 1 shows a core-shell nanofin vertical switch, according to some embodiments.

In an embodiment, core-shell nanofin vertical switch 100 includes substrate 102 disposed on n-type drift layer 108 proximate to drain terminus 103 and distal to source terminus 101, such that n-type drift layer 108 is interposed between substrate 102 and n-type channel 110, and n-type drift layer 108 and p-type nanofin shell 114 longitudinally extend away from substrate 102 toward source terminus 101.

In an embodiment, core-shell nanofin vertical switch 100 includes buffer layer 104 disposed on n-type drift layer 108 proximate to drain terminus 103 and distal to source terminus 101, such that he buffer layer 104 is interposed between substrate 102 and n-type drift layer 108. In an embodiment, buffer layer 104 provides a crystallographic template for epitaxial growth of n-type drift layer 108.

In an embodiment, core-shell nanofin vertical switch 100 includes growth mask 106 disposed on buffer layer 104, such that growth mask 106 is interposed between buffer layer 104 and p-type nanofin shell 114. In an embodiment, growth mask 106 electrically isolates buffer layer 104 and p-type nanofin shell 114.

In an embodiment, core-shell nanofin vertical switch 100 includes gate-drain dielectric fill 116 disposed on p-type nanofin shell 114 and interposed between growth mask 106 and gate contact 118. In an embodiment, gate-drain dielectric fill 116 electrically isolates gate contact 118 and buffer layer 104.

In an embodiment, core-shell nanofin vertical switch 100 includes source-gate dielectric fill 120 disposed on gate contact 118, such that source-gate dielectric fill 120 is interposed between source contact 122 and gate contact 118. In an embodiment, source-gate dielectric fill 120 electrically isolates gate contact 118 and source contact 122.

In an embodiment, core-shell nanofin vertical switch 100 includes drain contact 124 disposed on substrate 102, such that substrate 102 is interposed between drain contact 124 and n-type drift layer 108. In an embodiment, drain contact 124 is in electrical communication via ohmic contact with substrate 102 and n-type drift layer 108.

In an embodiment, source contact 122 is absent in core-shell nanofin vertical switch 100, and core-shell nanofin vertical switch 100 is a diode. In this configuration, core-shell nanofin vertical switch 100 can be used for rectification.

In an embodiment, core-shell nanofin vertical switch 100 includes source contact 122, and core-shell nanofin vertical switch 100 is a transistor. Accordingly, core-shell nanofin vertical switch 100 is a three-terminal, gallium-nitride transistor that controls electrical power.

It is contemplated that core-shell nanofin vertical switch 100 has a fin-based geometry and can be made by epitaxial growth that produces core-shell GaN nanostructures. N-type GaN nanofin core 107 can be grown under conditions that only produces growth in a longitudinal direction (also referred to as vertical growth) of n-type GaN nanofin core 107 with respect to substrate 102. Such growth can occur via a process described in U.S. Pat. No. 9,460,921, which is incorporated by reference herein in its entirety. P-type nanofin shell 114 is grown under conditions that produce uniform deposition on the sidewalls of n-type GaN nanofin core 107 at interface surface 105. The resulting core-shell p-n junction at interface surface 105 at the top section of the fin proximate to source terminus 101 is a junction field effect transistor (JFET), wherein the gate contact voltage is used to deplete or accumulate charge carriers in the n-type transistor channel, which produces the switching action of the transistor. Moreover, the arrangement of the components of n-type GaN nanofin core 107 and p-type nanofin shell 114 are configured as compatible with superjunction formation in which the doping in n-type GaN nanofin core 107 and p-type nanofin shell 114 are charge-balanced with opposite doping types (n-type vs. p-type). This superjunction can withstand high source-drain voltages without electrical breakdown.

It should be appreciated that core-shell nanofin vertical switch 100 can have elements present and arranged to provide a JFET or superjunction. However, while the superjunction is an advantageous and useful subcomponent, such is optional for operation of core-shell nanofin vertical switch 100 as a transistor or the clean interfaces of the core-shell structure (provided by n-type GaN nanofin core 107 and p-type nanofin shell 114).

Figure 2:
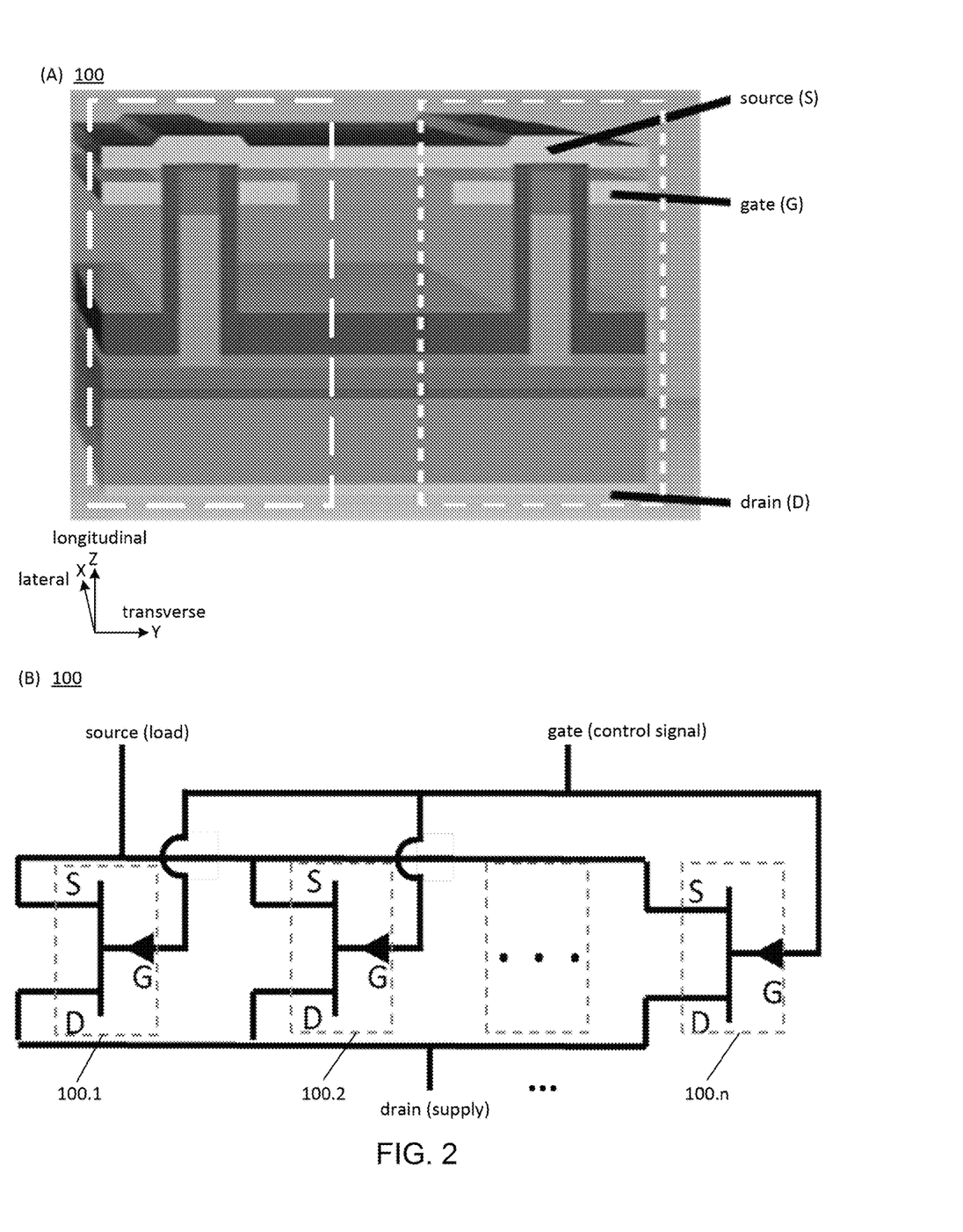
FIG. 2 shows: (A) a perspective view of a core-shell nanofin vertical switch; and (B) electrical connections for a plurality of core-shell nanofin vertical switches, according to some embodiments.

In an embodiment, with reference to FIG. 2, core-shell nanofin vertical switch 100 includes a plurality of switches (100.1, 100.2, . . . , 100.n, wherein n is an arbitrary positive non-zero integer that indexes the number of such switches). The switches can be arranged in an array of regular or irregular spacing or patterns. An exemplary arrangement is a linear array or two-dimensional array of switches that can be individually and selectively addressed and independently or synchronously switched together.

Core-shell nanofin vertical switch 100 includes various elements and components that can be, e.g., microfabricated. Elements of core-shell nanofin vertical switch 100 can be various sizes. Elements of core-shell nanofin vertical switch 100 can be made of a material that is physically or chemically resilient in an environment in which core-shell nanofin vertical switch 100 is disposed without impairing high-voltage switching of core-shell nanofin vertical switch 100. Exemplary materials include semiconductor, electrically conductive, and dielectric materials, dopants, and the like. The elements of n-type GaN nanofin core 107 can be made of the same or different material.

Substrate 102 provides a structure upon which other elements of core-shell nanofin vertical switch 100 can be formed. Substrate 102 is electrically conductive to conduct electrical current between buffer layer 104 and drain contact 124. Exemplary materials for substrate include semiconductor materials such as highly doped silicon, silicon carbide, or sapphire.

Buffer layer 104 is formed on substrate 102 and provides a crystallographic template for epitaxial growth of n-type GaN nanofin core 108. Buffer layer 104 can be electrically conductive to communicate electrical current between n-type GaN nanofin core 108 and substrate 102. Buffer layer 104 can be a planar AlN/GaN layer, where the AlN layer (e.g., from about 1 nm to 40 nm thick) provides crystallographic alignment to substrate 102, and GaN (e.g., about 300 nm thick) provides an electrically conductive crystal template for GaN nanostructure growth.

Growth mask 106 is formed and patterned on buffer layer 104 and includes a portion that delineates a footprint of GaN nanofin core 108 during epitaxial growth. Growth mask 106 can include a dielectric material to electrically isolate buffer layer 104 from GaN nanofin shell 114. The dielectric material can be, e.g., silicon nitride (e.g., from about 25 nm to 70 nm thick) or silicon dioxide. Growth mask 106 can be formed via deposition, including low-pressure chemical vapor deposition (LPCVD), plasma-enhanced chemical vapor deposition (PECVD), and the like. An opening in a portion of growth mask 106 can be formed by electron-beam lithography or could or by any lithography that can make a linewidth that can be, e.g., less than 200 nm. Such processing can include extreme ultraviolet (EUV) irradiation, nanoimprinting, and the like.

N-type drift layer 108 can be grown in the patterned mask opening of growth mask 106. It should be appreciated that n-type drift layer 108 and p-type nanofin shell 114 provide a p-n junction. Advantageously, the superjunction drift layer 108 supports high voltage between source contact 122 and drain contact 124 without electrical breakdown. The n-type doping concentration can be selected to enhance superjunction charge balance in n-type drift layer 108. In an embodiment, n-type drift layer 108 consists essentially of GaN. In an embodiment, n-type drift layer 108 can include dopants disposed in GaN.

N-type channel 110 can be grown on and with the same footprint as n-type drift layer 108 to form a p-n junction with p-type nanofin shell 114. N-type channel 110 and p-type nanofin shell 114 can provide a junction field effect transistor (JFET) that provides switching of electrical current between source contact 122 and drain contact 124 as controlled by gate voltage applied to gate contact 118. The n-type doping concentration of n-type channel 110 can be selected to enhance switching of n-type channel 110. In an embodiment n-type channel 110 consists essentially of GaN. In an embodiment, n-type channel 110 can include dopants disposed in GaN.

N-type source 112 can be grown on and with the same footprint as n-type channel 110. N-type source 112 can be highly doped with n-type dopant to enhance conductivity to source contact 122. In an embodiment, n-type source 112 consists essentially of GaN. In an embodiment, n-type source 112 can include dopants disposed in GaN.

N-type GaN nanofin core 107 includes n-type drift layer 108, n-type channel 110, and n-type source 112. N-type GaN nanofin core 107 can be formed, e.g., grown by selective area epitaxy, e.g., at a selected growth temperature, with vertical GaN growth in the opening of growth mask 106, which can provide a constant width along the fin structure. In this manner, GaN for n-type GaN nanofin core 107 is not growth on an upper surface of growth mask 106. Plasma-assisted molecular beam epitaxy can be used although viable techniques can be used such as metal-organic vapor phase epitaxy (MOVPE or MOCVD) or hydride vapor phase epitaxy (HVPE). N-type doping occurs by supplying silicon, germanium, or oxygen during growth and can be varied during growth of n-type GaN nanofin core 107 to produce different doping concentrations in n-type drift layer 108, n-type channel 110, or n-type source 112. The nanofins can be grown so as to obtain a select crystallographic orientation such as m-plane (10-10) or a-plane (11-20) sidewalls. The nanofins can be grown in the N-polar [000-1] or Ga-polar [0001] orientations.

P-type nanofin shell 114 can be formed, e.g., grown conformally, on n-type GaN nanofin core 107 including exposed surfaces of n-type drift layer 108, n-type channel 110, and n-type source 112 at interface surface 105. P-type nanofin shell 114 and n-type channel 110 provide a p-n junction field effect transistor that switches electrical current between source contact 122 and drain contact 124 as controlled by gate voltage received by gate contact 118. P-type nanofin shell 114 can include of a wider bandgap AlGaN to reduce leakage current between gate contact 118 and source contact 122. This increases the on-state gate voltage of the p-n junction field effect transistor and reduces the on-state resistance. It is contemplated that p-type nanofin shell 114 is grown over n-type GaN nanofin core 107 (108,110,112) as a continuation of the growth process and at conditions (e.g., a lower growth temperature), wherein growth occurs in both the vertical (i.e., longitudinal) and horizontal (i.e., lateral or transverse) directions. P-type doping can occur by including magnesium during GaN growth. P-type nanofin shell 114 can include aluminum to form the wide-bandgap ternary compound AlGaN to decrease gate leakage current and to increase the on-state gate voltage of core-shell nanofin vertical switch 100. P-type doping in AlGaN can occur by including magnesium or beryllium during AlGaN growth.

In an embodiment, p-type nanofin shell 114 consists essentially of aluminum, gallium, and nitrogen. In an embodiment, the aluminum, gallium, and nitrogen of p-type nanofin shell 114 includes $Al_xGa_{1-x}N$, wherein x is a nonnegative real number from 0 to 1.0.

N-type drift layer 108, n-type channel 110, n-type source 112, and p-type nanofin shell 114 in combination provide a core-shell GaN nanofin vertical switch. In an embodiment, with reference to FIG. 2, a plurality of individual core-shell GaN nanofin vertical switches (100.1, 100.2, ..., 100.n) can be disposed on substrate 102 and operated in parallel to obtain device operation at higher electrical currents.

Gate-drain dielectric fill 116 is interposed between gate contact 118 and p-type nanofin shell 114 to provide electrical isolation and mechanical support between gate contact 118, buffer layer 104, and proximate core-shell GaN nanofin vertical switches (e.g., 100.2, etc.) in array of such switches. Gate-drain dielectric fill 116 or source-gate dielectric fill 120 can electrically insulating, have high electrical breakdown endurance, and have good mechanical or thermal stability. Exemplary dielectric material for gate-drain dielectric fill 116 or source-gate dielectric fill 120 includes benzocyclobutene (BCB), silicon dioxide, silicon nitride, and the like, which can be selectively etched and planarized using reactive ion etching (e.g., with $SF_6/O_2$). A material with high thermal conductivity such as diamond can be used as a dielectric material.

Gate contact 118 is in electrical communication with p-type nanofin shell 114 that is in electrical communication with n-type channel 110. Gate contact 118 can be a global gate contact for a plurality of individual core-shell GaN nanofin vertical switches arranged in an array. Gate contact can be an electrically conductive metal layer formed (e.g., by deposition) on p-type nanofin shell 114. P-contacts to GaN and AlGaN can include nickel or gold for ohmic contact. It is contemplated that non-ohmic contacts can be used for gate contact 118.

Source-gate dielectric fill 120 provides electrical isolation between gate contact 118 and source contact 122 and can include a suitable dielectric material or this purpose.

Source contact 122 makes ohmic electrical contact with n-type source 112 and can be an electrically conductive metal layer deposited on n-type source 112. N-contacts to GaN can include titanium/aluminum metallization for ohmic contact. Low-resistance, ohmic-contact is made by source contact 122 to the n-type source 112. Such metallization can be non-ohmic with respect to p-type nanofin shell 114 and electrical current from the source contact metal flows only into n-type source 112. In some embodiments, p-type nanofin shell 114 can be absent proximate to source contact 122.

Drain contact 124 makes ohmic electrical contact to substrate 102 and electrical contact to n-type GaN nanofin core 107 via substrate 102 and buffer layer 104. Drain contact 124 can be an electrically conductive metal layer deposited on substrate 102 to provide a low-resistance, ohmic-contact. Drain contact 124 can made proximate to buffer layer 104 in a region not covered by core-shell nanofin vertical switches 100.

Core-shell nanofin vertical switch 100 can be made in various ways. It should be appreciated that core-shell nanofin vertical switch 100 includes a number of components, wherein such components can be interconnected and placed in electrical communication or electrical isolation. It should be appreciated that core-shell nanofin vertical switch 100 can be disposed in a terrestrial environment or space environment. Elements of core-shell nanofin vertical switch 100 can be formed from materials such as silicon, silicon nitride, sapphire, and the like although other suitable materials can be used. Accordingly, core-shell nanofin vertical switch 100 can be made by additive or subtractive manufacturing. In an embodiment, elements of core-shell nanofin vertical switch 100 are selectively etched to remove various different materials using different etchants and photolithographic masks and procedures. In some embodiments, various layers thus formed can be subjected to joining by bonding to form core-shell nanofin vertical switch 100.

Figure 3:
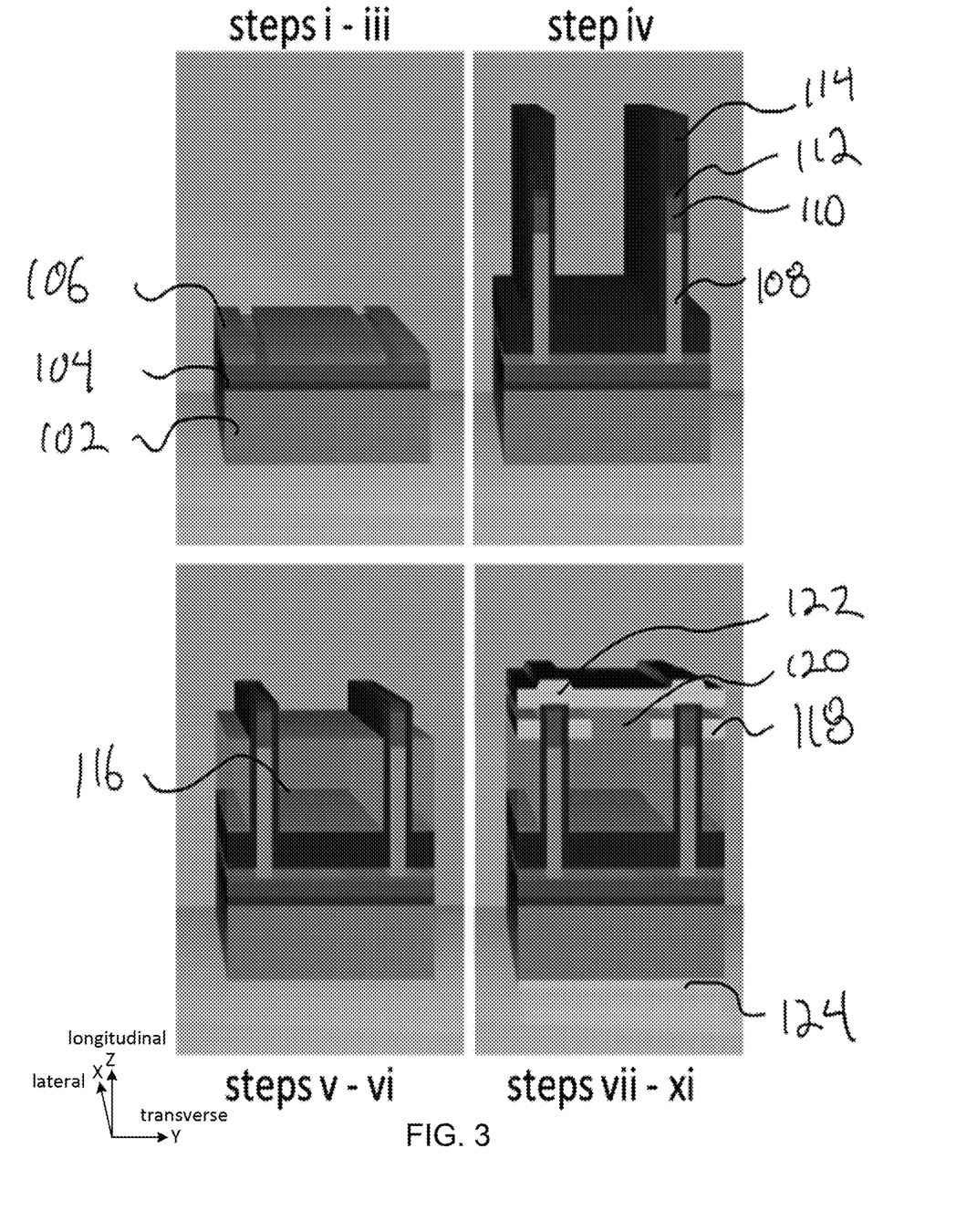
FIG. 3 shows formation of a core-shell nanofin vertical switch, according to some embodiments.
Figure 4:
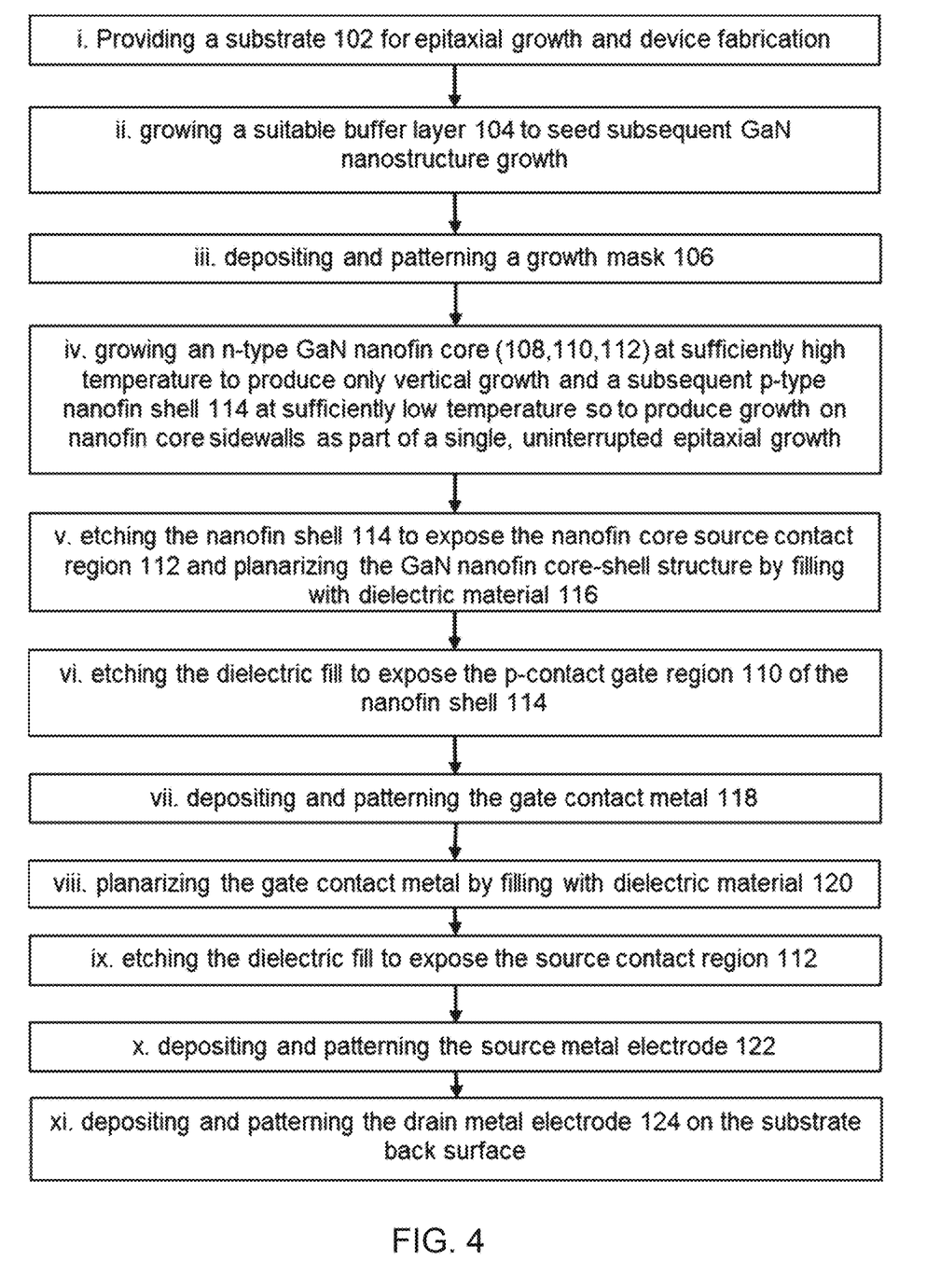
FIG. 4 shows a flowchart for making a core-shell nanofin vertical switch, according to some embodiments.

In an embodiment, with reference FIG. 3 and FIG. 4, a process for making core-shell nanofin vertical switch 100 includes: (i) providing substrate 102 to be subjected to forming (e.g., epitaxial growth) switch elements thereon; (ii) optionally forming buffer layer 104 as a seed for forming GaN nanostructure (optional, based on substrate 102); (iii) forming and patterning growth mask 106; (iv) forming n-type GaN nanofin core 107 by forming n-type drift layer 108 on substrate 102, n-type channel 110 on n-type drift layer 108, and n-type source 112 on n-type channel 110; optionally modulating n-type doping concentration along n-type drift layer 108 on substrate 102, n-type channel 110 on n-type drift layer 108, and n-type source 112; optionally forming undoped nanofin shell on n-type GaN nanofin core 107; and forming p-type nanofin shell 114 on n-type GaN nanofin core 107, such that forming n-type GaN nanofin core 107 and p-type nanofin shell 114 can occur in an uninterrupted epitaxial growth; (v) planarizing n-type GaN nanofin core 107 and p-type nanofin shell 114 (also referred to as the GaN nanofin core-shell structure) by forming dielectric material as gate-drain dielectric fill 116 at shell fin surface 109; (vi) etching gate-drain dielectric fill 116 to expose a portion of p-type nanofin shell 114 disposed at n-type channel 110; (vii) forming and patterning gate contact 118 on the exposed portion of p-type nanofin shell 114 disposed at n-type channel 110; (viii) planarizing gate contact 118 by forming source-gate dielectric fill 120 on gate contact 118; (ix) etching source-gate dielectric fill 120 at source terminus 101 so that source-gate dielectric fill 120 exposes a portion of p-type nanofin shell 114 and n-type source 112 at source terminus 101; (x) forming and patterning source contact 122 on the exposed portion of p-type nanofin shell 114 and n-type source 112 at source terminus 101; and (xi) forming and patterning drain contact 124 on substrate 102 such that substrate 102 is interposed between drain contact 124 and n-type drift layer 108 to form core-shell nanofin vertical switch 100, core-shell nanofin vertical switch 100 e.g., as shown in FIG. 1 and FIG. 2.

In an embodiment, n-type drift layer 108, n-type channel 110, n-type source 112, and p-type nanofin shell 114 are formed via continuous growth. This continuous core-shell growth avoids defects and impurities that can occur during other etch-and-regrowth based device architectures or formation processes. These deleterious etch-and regrowth processes incorporate parasitic defects and impurities in the device active region and adversely affect transistor performance. The process for making core-shell nanofin vertical switch 100 includes bottom-up growth of GaN nanostructures (107, 114) that also produces nearly defect-free GaN fins, regardless of the growth substrate and makes structures that are not limited by the defect structure. This provides a cost advantage because GaN nanofins can be made on inexpensive substrates (e.g., silicon) that may not be suitable for producing high-quality epitaxial structures by conventional planar growth techniques.

The process for making core-shell nanofin vertical switch 100 provides a vertical gallium-nitride-based switch (e.g., a diode or transistor) with core-shell structure that does not involve selective area regrowth at the p-n junction and avoids performance-reducing contamination in the device active area.

In making core-shell nanofin vertical switch 100, growing n-type GaN nanofin core 107 occurs at temperatures sufficiently high to produce only vertical growth (with optional modulation of n-type doping concentration along nanofin height to form drift 108, channel 110, and source contact 112 regions) and subsequently growing a p-type nanofin shell 114 (with optional Al mole fraction) at sufficiently low temperatures to produce growth on nanofin core sidewalls. The process can include growth of an undoped or lightly n-doped nanofin shell between the n-type core and p-type shell as part the single, uninterrupted epitaxial growth of n-type GaN nanofin core 107 and p-type nanofin shell 114.

The process for making core-shell nanofin vertical switch 100 can includes various conditions and steps described in U.S. Pat. No. 9,460,921, which is incorporated by reference herein in its entirety.

In making core-shell nanofin vertical switch 100, providing substrate 102 involves using a substrate with suitable crystal structure to be a template for epitaxial GaN growth. Exemplary substrates include silicon, silicon carbide, silicon-on-insulator, bulk GaN, and sapphire. Substrate 102 can be electrically conductive to communicate electrical current through substrate 102. When substrate 102 is not electrically conductive, current flows through electrically conductive buffer layer 104 to a drain contact located on a portion of buffer 104 surface that is free of core-shell nanofin vertical switches 100.

Growing of a buffer layer provides a crystallographic template for subsequently grown GaN nanofins. Buffer layers can include a thin AlN layer (e.g., from 1 nm to 40 nm thick) to improve orientation of epitaxial material to the substrate and a thicker (e.g., about 350 nm thick) GaN layer that allows for homoepitaxial growth of GaN nanofins. As a result, the buffer layer is electrically conducting to communicate electrical current in the longitudinal (i.e., vertical) direction and lateral direction.

Depositing a patterned growth mask defines the footprint of the GaN nanofins. The growth mask is a dielectric and can be silicon nitride or silicon dioxide. The growth mask can be electrically insulating and can have a thickness, e.g., of about 70 nm. The growth mask can be a single material or a combination of dielectric layers (e.g., a silicon dioxide/silicon nitride stack).

Growing an n-type GaN nanofin core by a selective area epitaxy growth can occur via molecular beam epitaxy, metal-organic vapor phase epitaxy, metal organic chemical vapor deposition, or hydride vapor phase epitaxy. In this step, the GaN epitaxy is carried out at a high growth temperature, wherein GaN growth on the mask surface is inhibited, and the GaN growing in the patterned nanofin mask opening occurs only in the vertical direction. N-type doping levels can be modulated during core growth to produce distinct drift, channel, and source contact regions. The n-type dopant can be silicon or germanium or oxygen. The nanofin can be oriented to produce (10-10) m-planes or (11-20) a-planes. The fin growth direction can be in the [000-1] N-polar or [0001] Ga-polar directions.

Growing p-type nanofin shell 114 occurs as part of uninterrupted epitaxial growth subsequent to formation of n-type GaN nanofin core 107. The substrate is not removed from the growth reactor between the core and shell steps of the growth process. The growth of the shell phase proceeds at a temperature low enough to grow p-type GaN on the n-type core 107 sidewalls at interface surface 105, creating a core-shell p-n junction. This eliminates contamination that can occur in conventional etch-and-regrowth fin-based processing. Such also is consistent with formation of lateral p-n junctions for a superjunction drift layer. P-type nanofin shell 114 can be AlGaN to reduce gate leakage current and increase the allowable on-state gate voltage of core-shell nanofin vertical switch 100. A lightly-doped n-type or undoped shell can be grown between n-type GaN nanofin core 107 and p-type nanofin shell 114.

As a result of making core-shell nanofin vertical switch 100 in accordance with the above process, the p-n junction core-shell nanofin (107, 114) is formed with epitaxial structure in vertical configuration with a superjunction drift layer 108.

In an embodiment, core-shell nanofin vertical switch 100 is prepared according to the following. To provide a low-cost silicon wafer and grow an AlN (5 nm)/GaN (350 nm) buffer layer, a 70 nm thick silicon nitride growth mask is patterned by electron beam lithography to form mask openings of ~160 nm×5000 nm that form the footprint of the n-type GaN nanofins. The GaN nanofin n-type cores are then grown by molecular beam epitaxy at a growth temperature exceeding 850° C. and to a height of 5000 nm. Without removing the wafer from the growth reactor, the growth temperature is lowered to 700° C. to grow a 70 nm thick p-type shell as part of a continuous core-shell growth.

Core-shell nanofin vertical switch 100 has numerous advantageous and unexpected benefits and uses. In an embodiment, a process for high-voltage switching with core-shell nanofin vertical switch 100 includes: receiving, by drain contact 124 of core-shell nanofin vertical switch 100, drain voltage, the core-shell nanofin vertical switch 100 including: n-type GaN nanofin core 107 including: n-type drift layer 108 arranged at drain terminus 103 of n-type GaN nanofin core 107 and including GaN; n-type channel 110 disposed on n-type drift layer 108 and including GaN; and n-type source 112 disposed on n-type channel layer 110, arranged at source terminus 101, and including GaN, such that n-type channel 110 is interposed between n-type source 112 and n-type drift layer 108; p-type nanofin shell 114 disposed on n-type GaN nanofin core 107, surrounding n-type GaN nanofin core 107 at interface surface 105 of n-type GaN nanofin core 107, and including GaN; optional source contact 122 disposed on n-type GaN nanofin core 107 and p-type nanofin shell 114 and in electrical communication with n-type source 112, such that n-type source 112 is interposed between source contact 122 and n-type channel 110; gate contact 118 disposed on p-type nanofin shell 114 and in electrical communication with p-type nanofin shell 114, such that p-type nanofin shell 114 is interposed between gate contact 118 and n-type channel 110, and gate contact 118 is interposed between source contact 122 and drain contact 124; and drain contact 124 disposed on n-type drift layer 108, such that drain contact 124 is in electrical communication via ohmic contact with n-type drift layer 108; turning on core-shell nanofin vertical switch 100 by: receiving, by gate contact 118, a gate voltage that is positive with respect to a ground potential; accumulating electron charge carriers in n-type GaN nanofin core 107 in response to receiving the gate voltage; flowing electrical current between source contact 122 and drain contact 124 in response to accumulating electron charge carriers; and turning off core-shell nanofin vertical switch 100 by: receiving, by gate contact 118, the gate voltage that is at ground potential or negative with respect to a ground potential; depleting the electron charge carriers from n-type GaN nanofin core 107 in response to receiving the gate voltage at ground potential or negative with respect to a ground potential; and terminating flow of electrical current between source contact 122 and drain contact 124 in response to depleting the electron charge carriers.

In an embodiment, the process for high-voltage switching includes placing source contact 122 and drain contact 124 in electrical communication and receiving the electrical current at source contact 122 in response to turning on core-shell nanofin vertical switch 100; and electrically isolating source contact 122 and drain contact 124 in response to turning off core-shell nanofin vertical switch 100.

In an embodiment, a potential difference between source contact 122 and the drain contact 124 after core-shell nanofin vertical switch 100 is subjected to turning is from 1 V to 1500 V, and core-shell nanofin vertical switch 100 is configured so that, without electrical breakdown or damage, core-shell nanofin vertical switch 100 withstands the potential difference between source contact 122 and drain contact 124 from 0 V to 1500 V.

In an embodiment, the process for high-voltage switching includes connecting an electrical load in electrical communication with source contact 122, so that the electrical load is: in electrical communication with drain contact 124 and receives the electrical current from source contact 122 in response to turning on core-shell nanofin vertical switch 100; and electrically isolated from drain contact 124 in response to turning off core-shell nanofin vertical switch 100.

The process for high-voltage switching can include connecting a load or power-converter circuit to the source contact, wherein the load or power-converter circuit can include an electrical motor or DC-DC power converter.

The process for high-voltage switching can include modulating the gate contact 118 voltage to energize a load or circuit and with an intentional actuation response.

Core-shell nanofin vertical switch 100 and processes disclosed herein have numerous beneficial uses. Advantageously, core-shell nanofin vertical switch 100 overcomes limitations and technical deficiencies of conventional devices and conventional processes. Core-shell nanofin vertical switch 100 and processes herein provide high-quality selective area growth of GaN nanofin cores and core-shell p-n junction nanofins using the selective area growth. Moreover, core-shell nanofin vertical switch 100 includes an electrically functional core-shell p-n junction with low-leakage, diode-like current-voltage characteristics using the core-shell selective area growth.

The articles and processes herein are illustrated further by the following Examples, which are non-limiting.

EXAMPLES

Example 1

Figure 5:
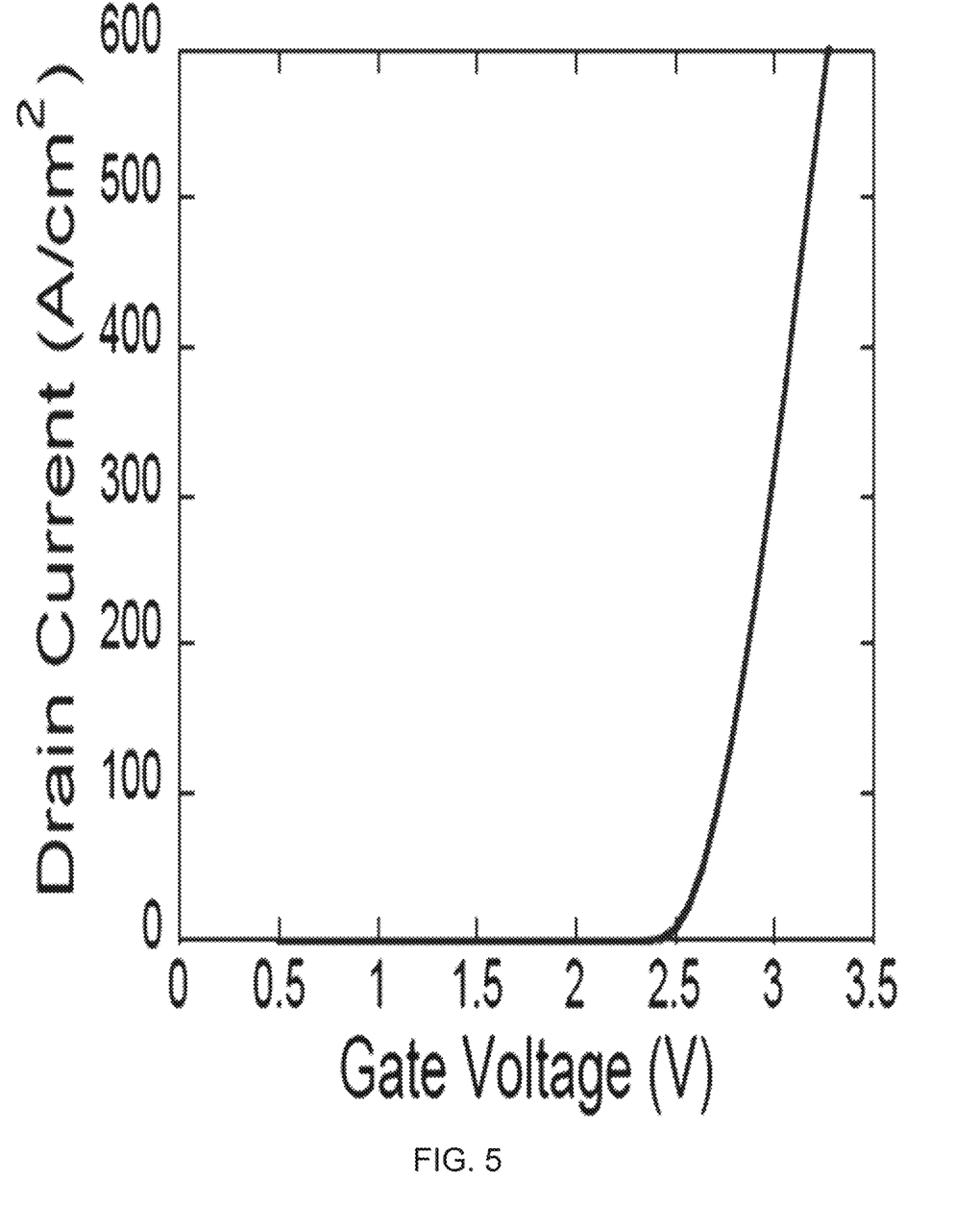
FIG. 5 shows a graph of drain current versus gate voltage for a core-shell nanofin vertical switch, according to some embodiments.
Figure 6:
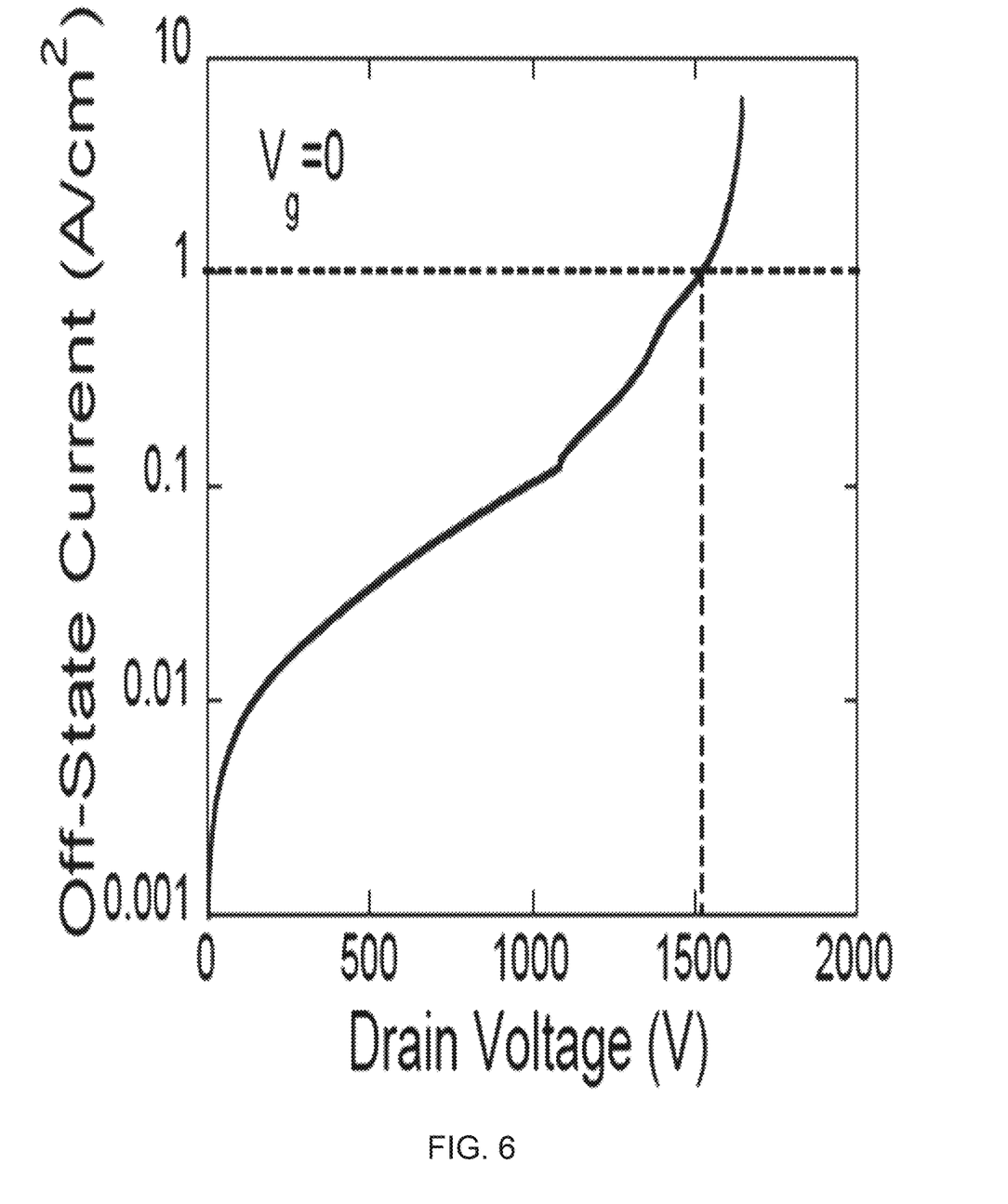
FIG. 6 shows a graph of off-state current versus drain voltage for a core-shell nanofin vertical switch, according to some embodiments.

By simulation, core-shell nanofin vertical switch 100 had a breakdown voltage greater than 1000 V, e.g., 1.5 kV, a threshold turn-on voltage of 2.5 V for normally-off operation, or an on-state resistance, e.g., of 0.18 mohm*cm^2. Simulations for electrical properties of core-shell nanofin vertical switch 100 are shown in FIG. 5 and FIG. 6.

The simulation was used to partially optimize the core-shell nanofin dimensions, doping concentrations, and p-shell Al content. As a result, the optimized structure had various physical attributes. The GaN nanofin core had a width of 160 nm and a height of 6 um. The n-type doping in the nanofin core was $1E17\ cm^{-3}$ in the superjunction drift layer and $5E16\ cm^{-3}$ in the channel region. The p-type shell was 70 nm thick and had a doping concentration of $5E17\ cm^{-3}$ in the channel region and $1E17\ cm^{-3}$ in the superjunction drift region. The Al mole fraction of the p-type shell layer was 0.15.

Example 2

Figure 7:
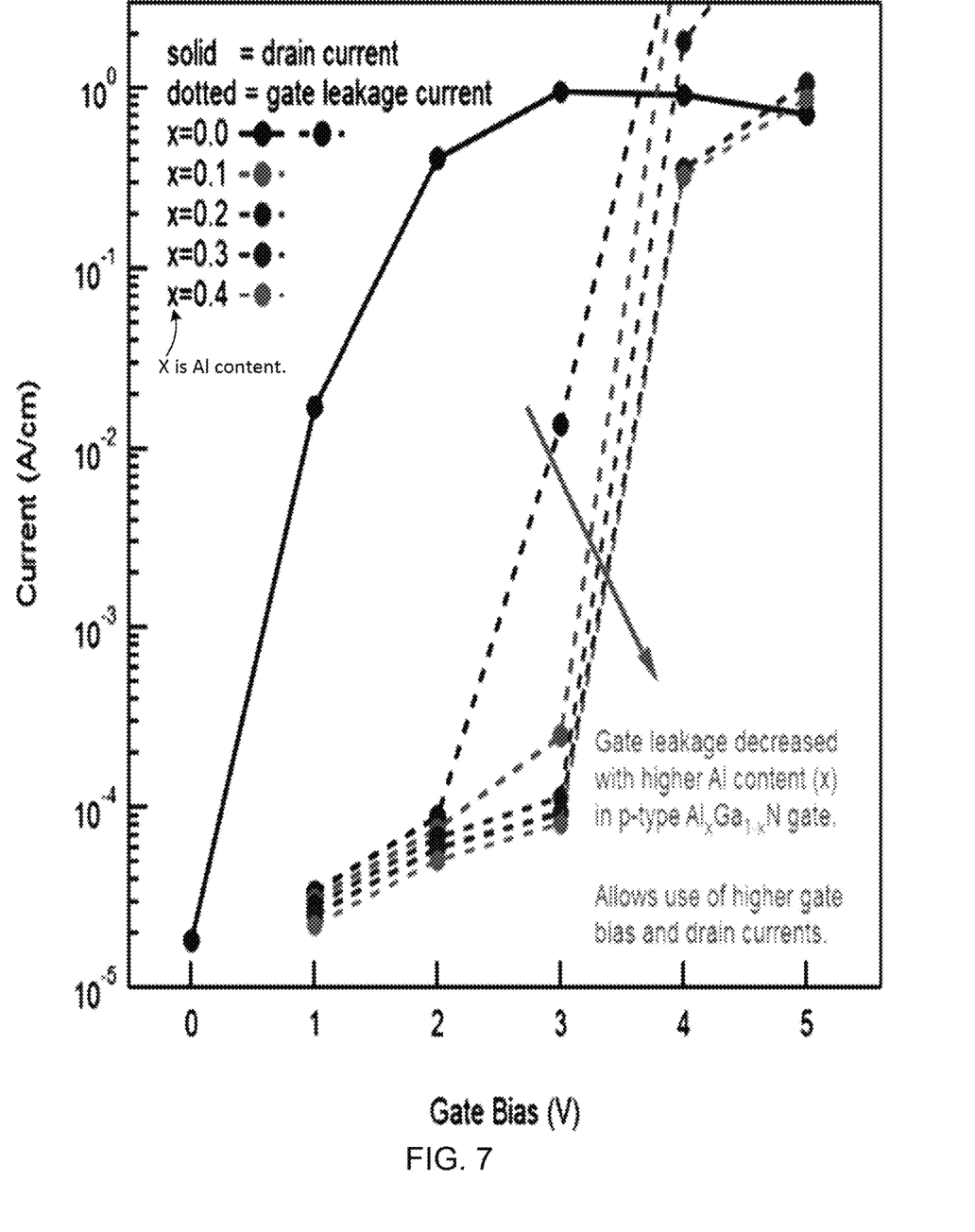
FIG. 7 shows a graph of current versus gate bias for a core-shell nanofin vertical switch, according to some embodiments.

Semiconductor device modeling showed that using an $Al_xGa_{1-x}N$ shell with Al mole fraction x decreased leakage current flowing through the gate contact. This allows higher gate biases to enhance the channel conductance and drain current without causing the gate p-n junction to become forward biased. Simulations showed that Al mole fraction x=0.1-0.2 produced reduction of the parasitic gate leakage current, as shown in FIG. 7.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are in mole fractions. The suffix (s) as used herein is intended to include both the singular and the plural of the term that it modifies, thereby including at least one of that term (e.g., the colorant(s) includes at least one colorants). Option, optional, or optionally means that the subsequently described event or circumstance can or cannot occur, and that the description includes instances where the event occurs and instances where it does not. As used herein, combination is inclusive of blends, mixtures, alloys, reaction products, collection of elements, and the like.

As used herein, a combination thereof refers to a combination comprising at least one of the named constituents, components, compounds, or elements, optionally together with one or more of the same class of constituents, components, compounds, or elements.

All references are incorporated herein by reference.

The use of the terms "a," "an," and "the" and similar referents in the context of describing the invention (especially in the context of the following claims) are to be construed to cover both the singular and the plural, unless otherwise indicated herein or clearly contradicted by context. It can further be noted that the terms first, second, primary, secondary, and the like herein do not denote any order, quantity, or importance, but rather are used to distinguish one element from another. It will also be understood that, although the terms first, second, etc. are, in some instances, used herein to describe various elements, these elements should not be limited by these terms. For example, a first current could be termed a second current, and, similarly, a second current could be termed a first current, without departing from the scope of the various described embodiments. The first current and the second current are both currents, but they are not the same condition unless explicitly stated as such.

The modifier about used in connection with a quantity is inclusive of the stated value and has the meaning dictated by the context (e.g., it includes the degree of error associated with measurement of the particular quantity). The conjunction or is used to link objects of a list or alternatives and is not disjunctive; rather the elements can be used separately or can be combined together under appropriate circumstances.

What is claimed is:

1. A core-shell nanofin vertical switch for high-voltage switching, the core-shell nanofin vertical switch comprising:
   an n-type GaN nanofin core comprising:
   an n-type drift layer arranged at a drain terminus of the n-type GaN nanofin core and comprising GaN;
   an n-type channel disposed on the n-type drift layer and comprising GaN; and an n-type source disposed on the n-type drift layer, arranged at a source terminus, and comprising GaN, such that the n-type channel is interposed between the n-type source and the n-type drift layer;

a p-type nanofin shell disposed on the n-type GaN nanofin core, surrounding the n-type GaN nanofin core at an interface surface of the n-type GaN nanofin core, and comprising GaN;

an optional source contact disposed on the n-type GaN nanofin core and the p-type nanofin shell and in electrical communication with the n-type source, such that the n-type source is interposed between the source contact and the n-type channel; and a gate contact disposed on the p-type nanofin shell and in electrical communication with the p-type nanofin shell, such that the p-type nanofin shell is interposed between the gate contact and the n-type channel, and the gate contact is interposed between the source contact and a drain contact.

2. The core-shell nanofin vertical switch of claim 1, wherein the source contact is present, and the core-shell nanofin vertical switch is a transistor.

3. The core-shell nanofin vertical switch of claim 1, wherein the source contact is absent, and the core-shell nanofin vertical switch is a diode.

4. The core-shell nanofin vertical switch of claim 1, further comprising a substrate disposed on the n-type drift layer proximate to the drain terminus and distal to the source terminus, such that the n-type drift layer is interposed between the substrate and the n-type channel, and the n-type drift layer and the p-type nanofin shell longitudinally extend away from the substrate toward the source terminus.

5. The core-shell nanofin vertical switch of claim 4, further comprising a buffer layer disposed on the n-type drift layer proximate to the drain terminus and distal to the source terminus, such that the buffer layer is interposed between the substrate and the n-type drift layer.

6. The core-shell nanofin vertical switch of claim 5, wherein the buffer layer provides a crystallographic template for epitaxial growth of the n-type drift layer.

7. The core-shell nanofin vertical switch of claim 6, further comprising a source-gate dielectric fill disposed on the gate contact, such that the source-gate dielectric fill is interposed between the source contact and the gate contact.

8. The core-shell nanofin vertical switch of claim 7, wherein the source-gate dielectric fill electrically isolates the gate contact and the source contact.

9. The core-shell nanofin vertical switch of claim 5, further comprising a growth mask disposed on the buffer layer, such that the growth mask is interposed between the buffer layer and the p-type nanofin shell.

10. The core-shell nanofin vertical switch of claim 9, wherein the growth mask electrically isolates the buffer layer and the p-type nanofin shell.

11. The core-shell nanofin vertical switch of claim 9, further comprising a gate-drain dielectric fill disposed on the p-type nanofin shell and interposed between the growth mask and the gate contact.

12. The core-shell nanofin vertical switch of claim 11, wherein the gate-drain dielectric fill electrically isolates the gate contact and the buffer layer.

13. The core-shell nanofin vertical switch of claim 4, further comprising a drain contact disposed on the substrate, such that the substrate is interposed between the drain contact and the n-type drift layer.

14. The core-shell nanofin vertical switch of claim 13, wherein the drain contact is in electrical communication via ohmic contact with the substrate and the n-type drift layer.

15. The core-shell nanofin vertical switch of claim 1, wherein the n-type drift layer consists essentially of GaN.

16. The core-shell nanofin vertical switch of claim 1, wherein the n-type channel consists essentially of GaN.

17. The core-shell nanofin vertical switch of claim 1, wherein the n-type source consists essentially of GaN.

18. The core-shell nanofin vertical switch of claim 1, wherein the p-type nanofin shell consists essentially of aluminum, gallium, and nitrogen.

19. The core-shell nanofin vertical switch of claim 1, wherein the aluminum, gallium, and nitrogen of the p-type nanofin shell comprises $Al_xGa_{1-x}N$, wherein x is a nonnegative real number from 0 to 1.0.

20. A process for high-voltage switching with a core-shell nanofin vertical switch, the process comprising:

receiving, by a drain contact of a core-shell nanofin vertical switch, a drain voltage, the core-shell nanofin vertical switch comprising:

an n-type GaN nanofin core comprising:
an n-type drift layer arranged at a drain terminus of the n-type GaN nanofin core and comprising GaN;
an n-type channel disposed on the n-type drift layer and comprising GaN; and
an n-type source disposed on the n-type drift layer, arranged at a source terminus, and comprising GaN, such that the n-type channel is interposed between the n-type source and the n-type drift layer;

a p-type nanofin shell disposed on the n-type GaN nanofin core, surrounding the n-type GaN nanofin core at an interface surface of the n-type GaN nanofin core, and comprising GaN;

an optional source contact disposed on the n-type GaN nanofin core and the p-type nanofin shell and in electrical communication with the n-type source, such that the n-type source is interposed between the source contact and the n-type channel;

a gate contact disposed on the p-type nanofin shell and in electrical communication with the p-type nanofin shell, such that the p-type nanofin shell is interposed between the gate contact and the n-type channel, and the gate contact is interposed between the source contact and the drain contact; and the drain contact disposed on the n-type drift layer, such that the drain contact is in electrical communication via ohmic contact with the n-type drift layer;

turning on the core-shell nanofin vertical switch by:
receiving, by the gate contact, a gate voltage that is positive with respect to a ground potential;
accumulating electron charge carriers in the n-type GaN nanofin core in response to receiving the gate voltage;
flowing electrical current between the source contact and the drain contact in response to accumulating electron charge carriers; and turning off the core-shell nanofin vertical switch by:
receiving, by the gate contact, the gate voltage that is at ground potential or negative with respect to a ground potential;
depleting the electron charge carriers from the n-type GaN nanofin core in response to receiving the gate voltage at ground potential or negative with respect to a ground potential; and terminating flow of electrical current between the source contact and the drain contact in response to depleting the electron charge carriers.

21. The process for high-voltage switching of claim 20, further comprising:
placing the source contact and the drain contact in electrical communication and receiving the electrical current at the source contact in response to turning on the core-shell nanofin vertical switch; and
electrically isolating the source contact and the drain contact in response to turning off the core-shell nanofin vertical switch.

22. The process for high-voltage switching of claim 20, wherein a potential difference between the source contact and the drain contact after the core-shell nanofin vertical switch is subjected to turning is from 1 V to at least 1500 V, and the core-shell nanofin vertical switch is configured so that, without electrical breakdown or damage, the core-shell nanofin vertical switch withstands the potential difference between the source contact and the drain contact from 0 V to at least 1500 V.

23. The process for high-voltage switching of claim 20, further comprising:
connecting an electrical load in electrical communication with the source contact, so that the electrical load is:
in electrical communication with the drain contact and receives the electrical current from the source contact in response to turning on the core-shell nanofin vertical switch; and
electrically isolated from the drain contact in response to turning off the core-shell nanofin vertical switch.

* * * * *